(12) United States Patent
Hautala et al.

(10) Patent No.: US 7,947,582 B2
(45) Date of Patent: May 24, 2011

(54) MATERIAL INFUSION IN A TRAP LAYER STRUCTURE USING GAS CLUSTER ION BEAM PROCESSING

(75) Inventors: John J. Hautala, Beverly, MA (US); Mitchell A. Carlson, Austin, TX (US)

(73) Assignee: TEL Epion Inc., Billerica, MA (US)

( * ) Notice: Subject to any disclaimer, the term of this patent is extended or adjusted under 35 U.S.C. 154(b) by 17 days.

(21) Appl. No.: 12/394,215

(22) Filed: Feb. 27, 2009

(65) Prior Publication Data

US 2010/0221905 A1 Sep. 2, 2010

(51) Int. Cl.
*H01L 21/425* (2006.01)
*H01J 27/00* (2006.01)

(52) U.S. Cl. ...... 438/515; 438/514; 250/424; 250/423 R

(58) Field of Classification Search .......... 438/510–569; 250/424–427, 423 R, 423 F, 423 P
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 5,907,780 A * | 5/1999 | Gilmer et al. | 438/299 |
| 6,124,620 A * | 9/2000 | Gardner et al. | 257/411 |
| 6,495,474 B1 | 12/2002 | Rafferty et al. | |
| 7,060,989 B2 | 6/2006 | Swenson et al. | |
| 7,173,252 B2 | 2/2007 | Mack | |
| 2002/0130275 A1 | 9/2002 | Mack et al. | |
| 2005/0085056 A1* | 4/2005 | Lai et al. | 438/526 |
| 2005/0272265 A1* | 12/2005 | Geffken et al. | 438/706 |
| 2008/0122076 A1 | 5/2008 | Hong et al. | |
| 2008/0237700 A1* | 10/2008 | Kim et al. | 257/326 |
| 2008/0296662 A1* | 12/2008 | Poeppel et al. | 257/325 |
| 2008/0299749 A1* | 12/2008 | Jacobson et al. | 438/513 |

FOREIGN PATENT DOCUMENTS

JP 62296357 A 12/1987

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).
Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.
Yamada, I. et al., Surface modification with gas cluster ion beams, Nuclear Instruments & Methods in Physics Research, vol. B79, Nov. 2, 1992, pp. 223-226, XP001031961, ISSN: 0168-583X.
European Patent Office, Search Report and Written Opinion issued in corresponding International Application No. PCT/US2010/023029 dated May 17, 2010, 10 pp.

* cited by examiner

*Primary Examiner* — Michael S Lebentritt
*Assistant Examiner* — Karen M Kusumakar
(74) *Attorney, Agent, or Firm* — Wood, Herron & Evans, LLP

(57) ABSTRACT

A method of preparing a floating trap type device on a substrate is described. The method comprises forming a trap layer structure on a substrate, and modifying a composition of one or more layers in the trap layer structure by exposing the trap layer structure to a gas cluster ion beam (GCIB).

22 Claims, 5 Drawing Sheets

MATERIAL INFUSION IN A TRAP LAYER STRUCTURE USING GAS CLUSTER ION BEAM PROCESSING

BACKGROUND OF THE INVENTION

1. Field of Invention

The invention relates to a method for modifying the composition of a trap layer structure using a gas cluster ion beam (GCIB) and, in particular, a method for infusing material in a charge trap layer using a GCIB.

2. Description of Related Art

A typical semiconductor memory device utilized during microprocessor operation is a volatile type of memory device. However, in the event of power interruption, the data stored in such a memory device is lost. An alternative to the volatile type of memory device is a non-volatile type memory device. The non-volatile type memory device retains stored information even when power is terminated. To achieve this function, non-volatile type memory devices may be supplied with a floating layer upon which charges may be stored or removed depending on a program or erase status of the device. Two types of such floating layer devices may include a floating gate type device and a floating trap type device.

A floating gate type device may include a conductive gate layer that floats due to its isolation by a surrounding insulating layer. The floating gate may be isolated from a substrate channel located below and from a control gate located above. The floating gate type device may be, respectively, programmed and erased by storing and removing charges as free carriers on the conductive floating gate. A floating trap type device may include a non-conductive layer that may be floating between a substrate channel and a control gate. The floating trap type device may be programmed and erased by storing and removing charges in traps in the non-conductive floating layer.

A known type of floating trap type device may be a silicon-oxide-nitride-oxide-semiconductor (SONOS) device. A SONOS device may include a tunneling insulating layer on a substrate, a charge trap layer on the tunneling layer, a blocking insulation layer on the charge trap layer, and a gate electrode on the blocking insulation layer. The substrate may include a P-type silicon substrate having N-type impurity layers formed on either side of the gate electrode as a source and drain. Thermal oxide may be used to form the tunneling layer and silicon nitride may be used as the charge trap layer. During operation, charges may be moved to and from the charge trap layer from and to the substrate in order to program and erase the memory cell.

To address certain shortcomings of SONOS technology, a floating trap type memory device including a metal (e.g., tantalum) layer, a high-k dielectric (e.g., aluminum oxide) layer, and a nitride-oxide-semiconductor layered structure (TANOS) has been introduced. In a TANOS device, a gate may be made of a metal, for example tantalum, and a blocking layer may be made of a high-k dielectric material, for example, aluminum oxide. The use of a high-k dielectric material as a blocking layer may be a significant feature of the TANOS architecture. Additional features of a TANOS device may include a high work function layer and a barrier metal layer as part of the gate electrode structure.

One emerging challenge facing non-volatile memory fabrication includes the ability to adjust and/or tune the material properties of the trap layer structure to optimize charge retention in the trap layer structure.

SUMMARY OF THE INVENTION

The invention relates to a method for preparing a floating trap type device on a substrate. The floating trap type device may be utilized in a non-volatile type memory device.

The invention further relates to infusing material into a floating trap type device on a substrate.

According to an embodiment, a method of preparing a floating trap type device on a substrate is described. The method comprises forming a trap layer structure on a substrate, and modifying a composition of one or more layers in the trap layer structure by exposing the trap layer structure to a gas cluster ion beam (GCIB).

According to another embodiment, a trap layer structure comprising GCIB-infused material is described.

DETAILED DESCRIPTION OF SEVERAL EMBODIMENTS

Figure 1:
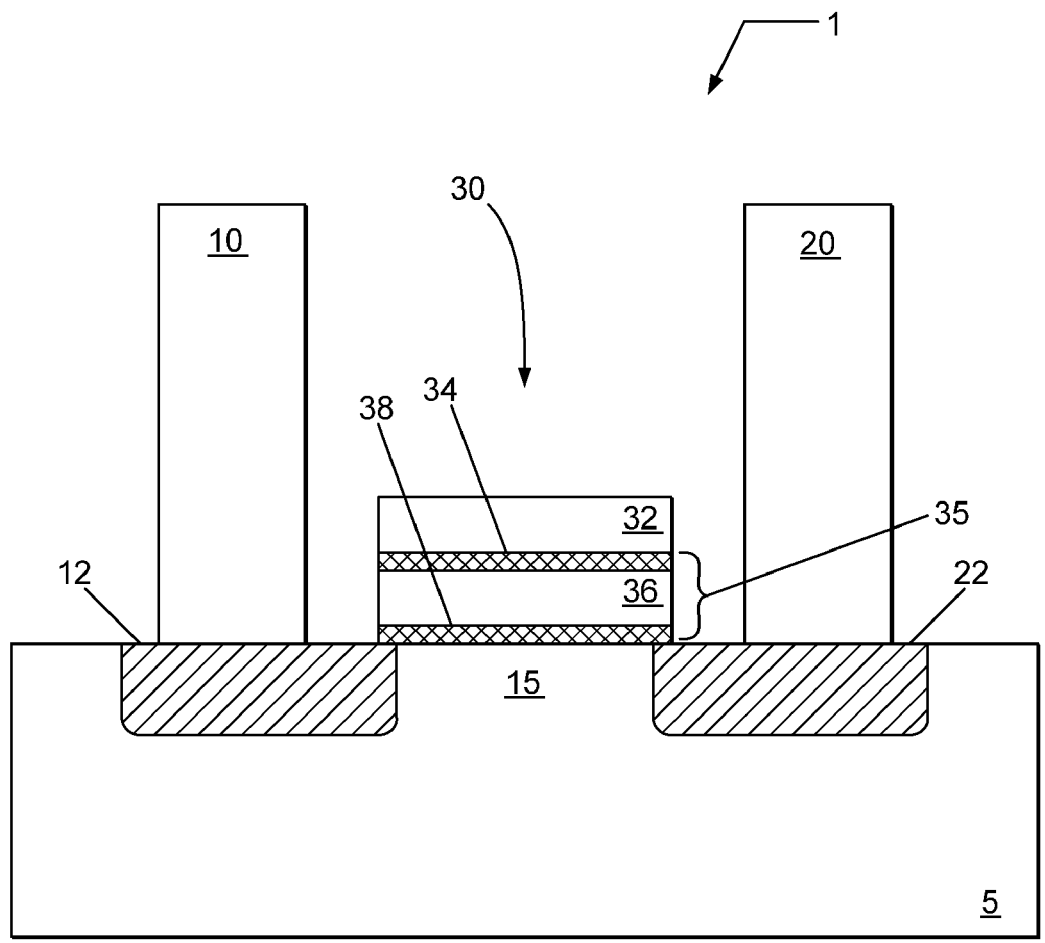
FIG. 1 illustrates, in schematic cross-sectional view, a non-volatile type memory device.

A method for forming a floating trap type device on a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, there is a general need for adjusting and/or tuning the material properties of a trap layer structure to optimize charge retention in the trap layer structure. For example, the trap layer structure may be utilized in a non-volatile type memory device.

In accordance with embodiments of the invention, the method includes forming a trap layer structure on a substrate, and modifying a composition of one or more layers in the trap layer structure by exposing the trap layer structure to a gas cluster ion beam (GCIB). By way of example, the GCIB may be used to alter a concentration of one or more species introduced within the one or more layers, a concentration profile of one or more species introduced within the one or more layers, or depth of one or more species introduced within the one or more layers, or any combination thereof. The GCIB may introduce one or more species selected from B, C, Si, Ge, N, P, As, O, S, or Cl. The one or more layers may include, for example, a tunneling insulating layer, a charge trap layer, or a blocking insulating layer, as will be described in greater detail below, or a combination of two or more thereof. One or more properties in the one or more layers, or in one or more sub-layers of the one or more layers, of the trap layer structure may also be modified. For example only and not limitation, a charge trap layer in a trap layer structure may comprise a silicon nitride, a silicon oxynitride, or a silicate, and the charge trap layer may be exposed to one or more GCIBs comprising Si, N and/or O and an optional inert gas to infuse the Si, N and/or O into the charge trap layer to modify the composition and/or properties of the charge trap layer.

Referring now to the drawings wherein like reference numerals designate corresponding parts throughout the several views, FIG. 1 illustrates, in a schematic cross-sectional view, a non-volatile type memory device 1. The memory device 1 comprises a transistor gate 30 disposed between a source 10, or source line, and a drain 20, or bit line. The memory device 1 may comprise a plurality of transistor gates 30 disposed between the source 10 and drain 20. The transistor gate 30 comprises a trap layer structure 35 disposed between a substrate 5 and a gate electrode 32. Additionally, the trap layer structure 35 may comprise a non-conductive layer (not shown) floating between a substrate channel 15 in substrate 5 and gate electrode 32. Further, the trap layer structure 35 may comprise a tunneling insulating layer 38 formed on substrate 5, a charge trap layer 36 formed on the insulating tunneling layer 38, and a blocking insulating layer 34 formed on the charge trap layer 36. The substrate 5 may include a P-type silicon substrate having N-type impurity regions 12 and 22 formed on either side of the transistor gate 30 at the source 10 and the drain 20, respectively. During operation, charges may be moved to and from the charge trap layer 36 from and to substrate 5 in order to program and erase the memory device 1.

Substrate 5 may include a single crystal silicon layer, a polycrystalline silicon (poly-silicon) layer, a silicon-on-insulator (SOI) substrate, or a silicon on silicon-germanium (SiGe) substrate, or any combination of two or more thereof.

The tunneling insulating layer 38 may, for example, include one or more layers of silicon oxide, silicon oxynitride (SiON), silicon nitride, a silicon oxide layer having a nitride portion, aluminum oxide ($Al_2O_3$), an aluminate such as hafnium aluminate (HfAlO), hafnium aluminum oxynitride (HfAlON), a silicate such as hafnium silicate (HfSiO), and hafnium silicon oxynitride (HfSiON). By way of example and not limitation, the tunneling insulating layer 38 may be modified by the GCIB by infusing Si, O and/or N into one or more of the layers thereof.

Additionally, the tunneling insulating layer 38 may include multiple layers. For example, the tunneling insulating layer 38 may include a low dielectric constant (low-k) dielectric layer, and a high dielectric constant (high-k) dielectric layer formed on the low-k dielectric layer. The low-k dielectric layer may have a dielectric constant less than or equal to 4. For instance, the low-k layer may include silicon oxide, silicon oxynitride, silicates, or silicon nitride. The high-k dielectric layer may have a dielectric constant greater than 4. For instance, the high-k layer may include silicon nitride ($Si_3N_4$), aluminum oxide ($Al_2O_3$), lanthanum oxide ($La_2O_3$), zirconium oxide ($ZrO_2$), an aluminate such as hafnium aluminate (HfAlO), and hafnium silicon oxynitride (HfSiON). Additionally, for instance, the high-k dielectric layer may include mixtures of high-k materials. The GCIB exposure may modify one or more of the multiple layers.

The charge trap layer 36 may, for example, include one or more layers of silicon, an oxide, a nitride, an oxynitride, an aluminate, or a nano-crystalline material. The charge trap layer 36 may, for example, include one or more layers of poly-silicon, silicon nitride, silicon oxynitride, silicon-rich oxide, a ferroelectric material, nano-crystalline silicon, nano-crystalline silicon germanium, nano-crystalline metal, amorphous silicon (a-Si), aluminum oxide ($Al_2O_3$), aluminum nitride (AlN), hafnium oxide ($HfO_2$), yttrium oxide ($Y_2O_3$), lanthanum oxide ($La_2O_3$), an aluminate such as hafnium aluminate (HfAlO) or zirconium aluminate (ZrAlO), hafnium aluminum oxynitride (HfAlON), hafnium silicate (HfSiO), hafnium silicon oxynitride (HfSiON), zirconium oxide ($ZrO_2$), tantalum oxide ($Ta_2O_5$), or titanium oxide ($TiO_2$). Additionally, the charge trap layer 36 may include a quantum-dot layer. For example, charge trap layer 36 may include a layer of silicon, germanium, and/or metal quantum-dots. By way of example and not limitation, the charge trap layer 36 may be modified by the GCIB by infusing Si, O and/or N into one or more of the layers thereof.

According to various embodiments, the blocking insulating layer 34 may comprise one or more layers of silicon oxide, silicon oxynitride (SiON), silicon nitride, an oxide including but not limited to an oxide of a Group 3 (IIIB) (Note: the use of Arabic numbers, i.e., Groups, 1, 2, 3, 4, 5, etc., is based on modern IUPAC nomenclature), 13 (IIIA), 4 (IVB), 14 (IVA), or 5 (VB) element, an oxynitride including but not limited to an oxynitride of a Group 3 (IIIB), 13 (IIIA), 4 (IVB), 14 (IVA), or 5 (VB) element, a metal oxide, a metal oxynitride, a doped metal oxide or a doped metal oxynitride. In one embodiment, the blocking insulating layer 34 may, for example, include a metal oxide or a metal oxynitride of a Group 3 (IIIB) or 13 (IIIA) element (e.g., a rare earth metal, an actinide metal, Al, Ga, In or Tl) or a Group 5 (VB) element (e.g., Ta). In another embodiment, the blocking insulating layer 34 may, for example, include a doped metal oxide or a doped metal oxynitride in which the metal oxide or oxynitride may be doped with a Group 4 (IVB) or 14 (IVA) element (.e.g., Ti, Zr, Hf, Rf, C, Si, Ge, Sn, or Pb). The Group 4 (IVB) or 14 (IVA) element may reduce leakage current from the memory device 1. A metal oxide or oxynitride may be doped with a Group IV element to a concentration of about 0.1 to about 30 percent by weight. By way of example and not limitation, the blocking insulating layer 34 may, for example, include one or more layers of silicon oxide, silicon oxynitride (SiON), silicon nitride, aluminum oxide ($Al_2O_3$), hafnium oxide ($HfO_2$), hafnium aluminate ($Hf_{1-x}Al_xO_y$), hafnium aluminum oxynitride (HfAlON), hafnium silicate ($Hf_xSi_{1-x}O_2$), hafnium silicon oxynitride (HfSiON), lanthanum oxide (La$_2$O$_3$), zirconium oxide (ZrO$_2$), zirconium silicon oxide (Hf$_x$Al$_{1-x}$O$_2$), and/or zirconium silicon oxynitride (ZrSiON)). By way of example and not limitation, the blocking insulating layer 34 may be modified by the GCIB by infusing Si, O and/or N into one or more of the layers thereof.

By way of further example, the blocking insulating layer 34 may comprise Al$_2$O$_3$ having a dielectric constant of about 10 and an energy band gap of about 8.3 eV, and/or ZrO$_2$ having a dielectric constant of about 25 and an energy band gap of about 8.3 eV. In yet another embodiment, the blocking insulating layer 34 may also comprise one or more layers of AlO, Ta$_2$O$_5$, TiO$_2$, PZT [Pb(Zr, Ti)O$_3$], PbTiO$_3$, PbZrO$_3$, PLZT [(Pb,La)(Zr, Ti)O$_3$], PbO, SrTiO$_3$, BaTiO$_3$, V$_2$O$_5$, BST [(Ba,Sr)TiO$_3$], SBT (SrBi$_2$Ta$_2$O$_9$), or Bi$_4$Ti$_3$O$_{12}$, and combinations thereof.

Additionally, the blocking insulating layer 34 may include a layer similar to that of the charge trap layer 36. For instance, both the blocking insulating layer 34 and the charge trap layer 36 may include a layer of hafnium aluminate (HfAlO), hafnium aluminum oxynitride (HfAlON), hafnium silicate (HfSiO) and/or hafnium silicon oxynitride (HfSiON). In such a case, a relative stoichiometric amount of hafnium in the charge trap layer 36 may be higher than the relative stoichiometric amount of hafnium in the blocking insulating layer 34 so as to increase a trap density in the charge trap layer 36 and to enhance an insulation characteristic of the blocking insulating layer 34.

Furthermore, the blocking insulating layer 34 may have a dielectric constant higher than that of the tunnel insulating layer 38. For example, the blocking insulating layer 34 may include at least one layer of material having a dielectric constant that may be higher than any layer included in the tunneling insulating layer 38. Alternatively, the blocking insulating layer 34 and the tunneling insulating layer 38 may be formed of materials having substantially similar dielectric constants (e.g., these layers may be formed of the same material). In this case, the blocking insulating layer 34 may have a thickness that may be greater than a thickness of the tunneling insulating layer 38.

The gate electrode 32 comprises a layer of an electrically conductive material. For example, the gate electrode 32 may include undoped poly-silicon, doped poly-silicon, tantalum (Ta), tantalum nitride (TaN), tantalum titanium (TaTi), tantalum platinum (TaPt), tantalum silicon nitride (TaSiN), titanium (Ti), titanium nitride (TiN), titanium aluminide (Ti$_3$Al), titanium aluminum nitride (Ti$_2$AlN), tungsten (W), tungsten nitride (WN), tungsten silicide (WSi), hafnium (Hf), hafnium nitride (HfN), niobium (Nb), molybdenum (Mo), molybdenum nitride (Mo$_2$N), ruthenium (Ru), ruthenium dioxide (RuO$_2$), nickel silicide (NiSi), palladium (Pd), iridium (Ir), platinum (Pt), cobalt (Co), cobalt silicide (CoSi), or aluminum silicide (AlSi), or any combination of two or more thereof. In addition, the gate electrode 32 may include a thin cap layer (e.g., above) and/or a thin interfacial layer (e.g., below) (neither shown), which layers may comprise oxides or oxynitrides useful for integrating the gate electrode with the adjacent layers. Any of the layer of conductive material, a cap layer or an interfacial layer associated with the gate electrode 32 may be modified by the GCIB according to embodiments of the invention. For example, the conductive material layer may be infused with nitrogen or silicon, and the cap layer or interfacial layer may be infused with oxygen, nitrogen and/or silicon.

Additionally, the gate electrode 32 may comprise a multi-layered conducting structure. The multi-layered conducting structure may include an energy barrier layer, a barrier metal layer, and a low resistance layer. The energy barrier layer may be formed above the blocking insulating layer, and may include a metal having a work function greater than about 4 eV. For example, the energy barrier layer may include one or more layers of, for example, tantalum (Ta), tantalum nitride (TaN), tantalum titanium (TaTi), tantalum platinum (TaPt), tantalum silicon nitride (TaSiN), titanium (Ti), titanium nitride (TiN), titanium aluminide (Ti$_3$Al), titanium aluminum nitride (Ti$_2$AlN), tungsten (W), tungsten nitride (WN), tungsten silicide (WSi), hafnium (Hf), hafnium nitride (HfN), niobium (Nb), molybdenum (Mo), molybdenum nitride (Mo$_2$N), ruthenium (Ru), ruthenium dioxide (RuO$_2$), nickel silicide (NiSi), palladium (Pd), iridium (Ir), platinum (Pt), cobalt (Co), cobalt silicide (CoSi), or aluminum silicide (AlSi).

The barrier metal layer may be formed above the energy barrier layer. The barrier metal layer may be formed of a material that reduces or prevents an interfacial reaction and/or mutual diffusion between the blocking insulating layer or energy barrier layer and the low resistance layer. The barrier metal layer may include one or more layers of, for example, tungsten nitride (WN), tungsten silicon nitride (WSiN), titanium nitride (TiN), or any other metal nitride that aides in preventing or reducing an interfacial reaction and/or mutual diffusion.

The low resistance layer may be formed above the barrier metal layer. The low resistance layer may include one or more layers of, for example, tungsten (W), copper (Cu), aluminum (Al), gold (Au), silver (Ag), molybdenum (Mo), titanium (Ti), platinum (Pt), palladium (Pd) and other low resistance materials.

As an example, the memory device 1 may include a silicon-oxide-nitride-oxide-semiconductor (SONOS) device. Therein, the gate electrode 32 comprises silicon, and the trap layer device 35 comprises an ONO structure. For instance, in the ONO structure, the tunneling insulating layer 38 can include silicon oxide formed using a thermal oxide process, the charge trap layer 36 can include silicon nitride, and the blocking insulating layer 34 can include silicon oxide.

As another example, the memory device 1 may include a tantalum-oxide-nitride-oxide-semiconductor (TANOS) device. Therein, the gate electrode 32 comprises a metal or metal-containing layer, such as Ta, and the trap layer device 35 comprises an ONO structure. For instance, in the ONO structure, the tunneling insulating layer 38 can include silicon oxide formed using a thermal oxide process, the charge trap layer 36 can include silicon nitride, and the blocking insulating layer 34 can include a high dielectric constant (high-k) dielectric layer, such as aluminum oxide.

According to an embodiment, a method of preparing a floating trap type device on a substrate is described. The method comprises forming a trap layer structure on a substrate, and modifying a composition of one or more layers in the trap layer structure by exposing the trap layer structure to one or more gas cluster ion beams (GCIB).

Figure 2:
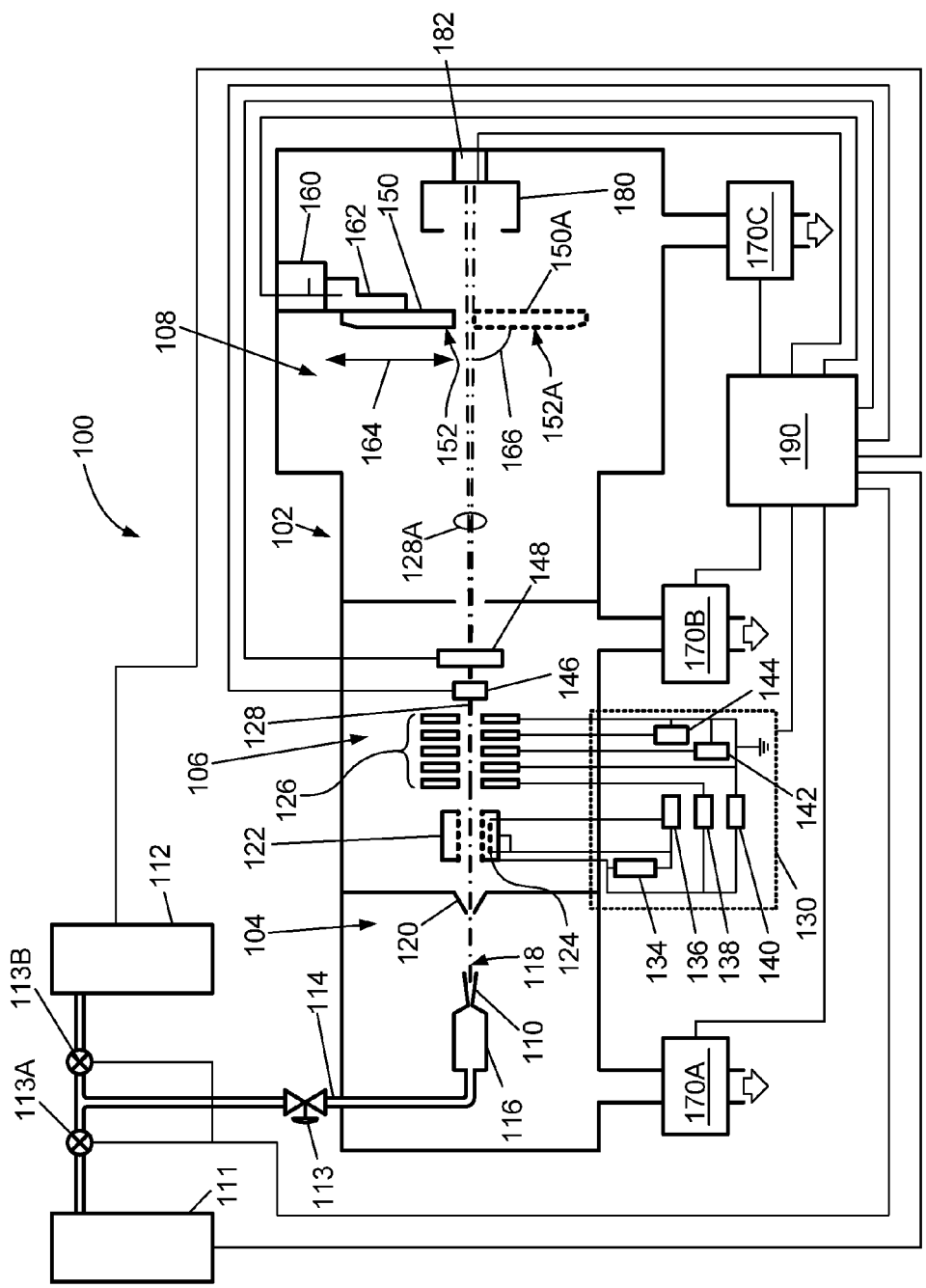
FIG. 2 is an illustration of a GCIB processing system.

Referring now to FIG. 2, a GCIB processing system 100 for modifying the composition of a trap layer structure as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 2, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 2, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to be introduced to the floating trap type device.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 2, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 2, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 2, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 2, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 4, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 2, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 3:
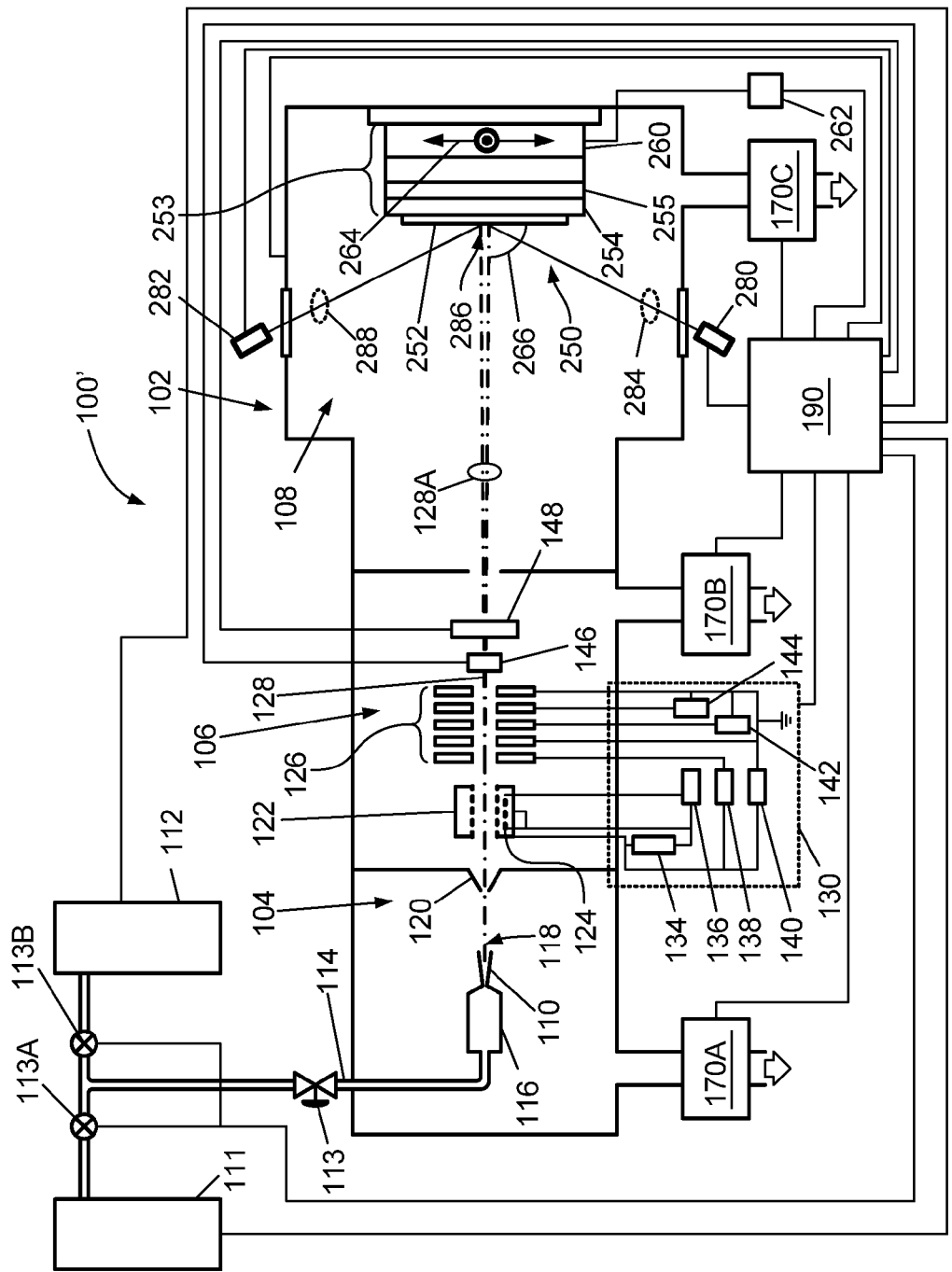
FIG. 3 is another illustration of a GCIB processing system.

In the embodiment shown in FIG. 3, the GCIB processing system 100' can be similar to the embodiment of FIG. 2 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 2) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 4:
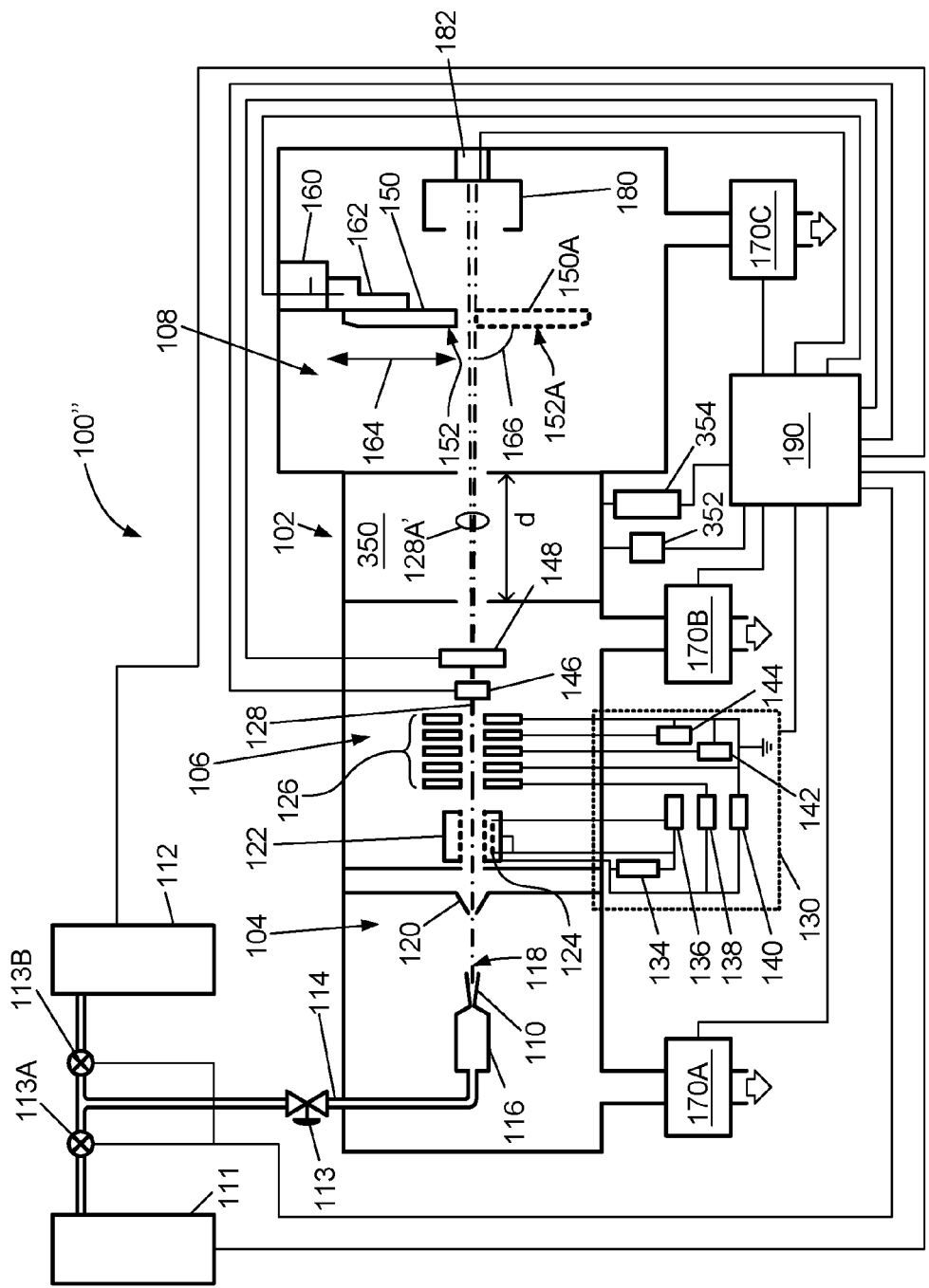
FIG. 4 is yet another illustration of a GCIB processing system.

In the embodiment shown in FIG. 4, the GCIB processing system 100" can be similar to the embodiment of FIG. 2 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along that portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 5:
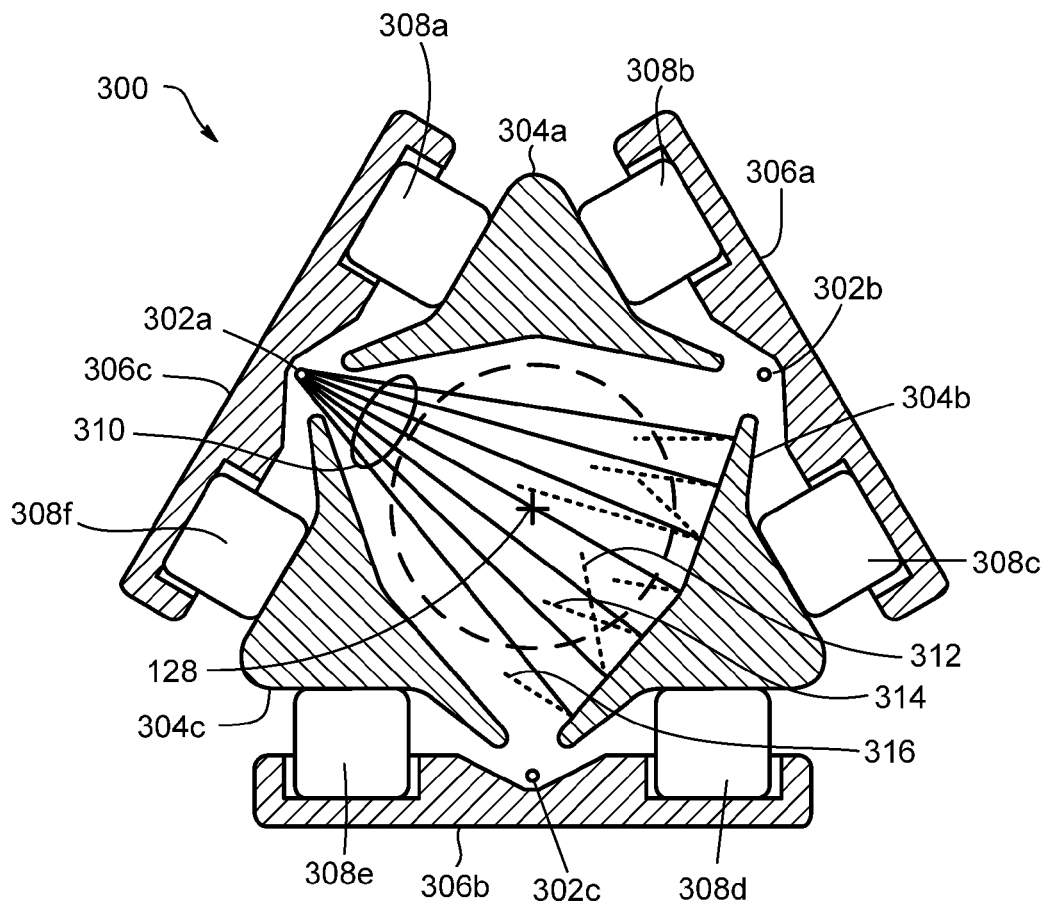
FIG. 5 is an illustration of an ionization source for a GCIB processing system.

Referring now to FIG. 5, a section 300 of a gas cluster ionizer (122, FIGS. 2, 3 and 4) for ionizing a gas cluster jet (gas cluster beam 118, FIGS. 2, 3 and 4) is shown. The section 300 is normal to the axis of GCIB 128. For typical gas cluster sizes (2000 to 15000 atoms), clusters leaving the skimmer aperture (120, FIGS. 2, 3 and 4) and entering an ionizer (122, FIGS. 2, 3 and 4) will travel with a kinetic energy of about 130 to 1000 electron volts (eV). At these low energies, any departure from space charge neutrality within the ionizer 122 will result in a rapid dispersion of the jet with a significant loss of beam current. FIG. 5 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 2, 3 and 4) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figure 6:
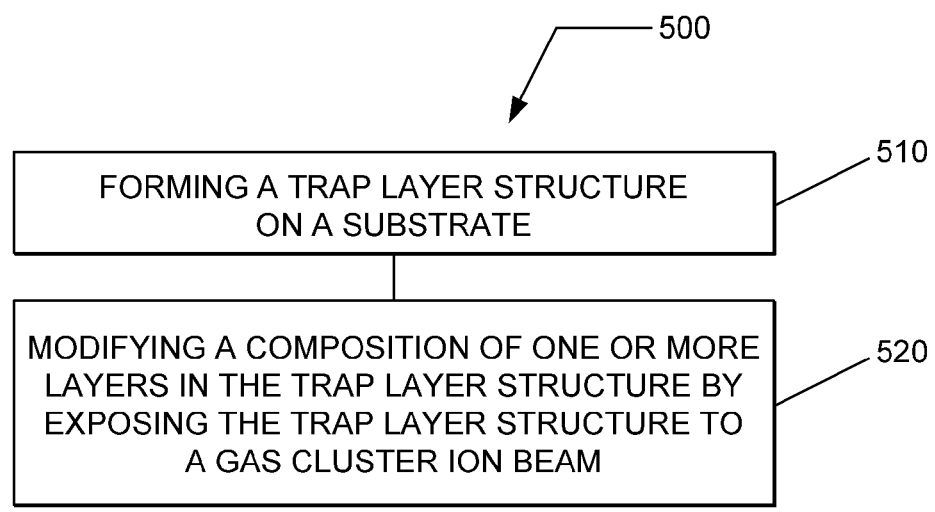
FIG. 6 is a flow chart illustrating a method for preparing a charge trap layer on a substrate according to an embodiment.

Referring to FIG. 6, a method of preparing a floating trap type device on a substrate is illustrated according to an embodiment. The method comprises a flow chart 500 beginning in 510 with forming a trap layer structure on a substrate. The trap layer structure may include any structure and/or material disclosed above. For example, the trap layer structure may be utilized in a floating trap type device for use in non-volatile memory. Additionally, for example, the trap layer device may include a SONOS-type or TANOS-type gate stack.

In 520, a composition of one or more layers in the trap layer structure is modified by exposing the trap layer structure to one or more GCIBs. Each GCIB can be formed in a GCIB processing system, such as any of the GCIB processing systems (100, 100' or 100") described above in FIG. 2, 3 or 4, or any combination thereof.

A substrate having the trap layer structure thereon may be positioned in a GCIB processing system on a substrate holder and may be securely held by the substrate holder. The temperature of the substrate may or may not be controlled. For example, the substrate may be heated or cooled during a GCIB exposure process. The environment surrounding the substrate is maintained at a reduced pressure.

A GCIB is generated in the reduced-pressure environment, and can be generated from a pressurized gas mixture. The pressurized gas mixture may use a material source comprising one or more elements selected from the group consisting of B, C, Si, Ge, N, P, As, O, S, and Cl. For example, the material source comprises $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4$, $C_3H_6$, $C_3H_8$, $C_4H_6$, $C_4H_8$, $C_4C_{10}$, $C_5H_8$, $C_5H_{10}$, $C_6H_6$, $C_6H_{10}$, $C_6H_{12}$, $BF_3$, $B_2H_6$, $AsH_3$, $AsF_5$, $PH_3$, $PF_3$, $PCl_3$, or $PF_5$, or any combination of two or more thereof.

Furthermore, the pressurized gas mixture may comprise an optional inert gas. The optional inert gas may comprise a noble gas.

A beam acceleration potential and a beam dose can be selected. The beam acceleration potential and the beam dose can be selected to achieve pre-specified properties in the one or more layers of the trap layer structure. For example, the beam acceleration potential and/or beam dose may be adjusted to alter a concentration of one or more species introduced within the one or more layers, a concentration profile of one or more species introduced within the one or more layers, or depth of one or more species introduced within the one or more layers, or any combination thereof. The beam acceleration potential may range up to 100 kV, and the beam dose may range up to about $1 \times 10^{16}$ clusters per $cm^2$. The GCIB is accelerated according to the beam acceleration potential, and the substrate is exposed to the GCIB according to the beam dose. For example, the beam acceleration potential may be used to modify the depth of the one or more species in the one or more layers of the trap layer structure, i.e., increasing the beam acceleration potential increases the depth and decreasing the beam acceleration potential decreases the depth. Additionally for example, the beam dose may be used to modify the concentration of the one or more species in the one or more layers of the trap layer structure, i.e., increasing the beam dose increases the final concentration and decreasing the beam dose decrease the final concentration.

Additionally, other GCIB properties may be varied to adjust the properties of one or more layers in the trap layer structure including, but not limited to, gas flow rate, stagnation pressure, cluster size, or gas nozzle design (such as nozzle throat diameter, nozzle length, and/or nozzle divergent section half-angle). Furthermore, other layer properties may be varied by adjusting the GCIB properties including, but not limited to, film density, film quality, etc.

In addition to the beam acceleration potential (e.g., maximum beam energy) and the beam dose, a beam energy distribution function of the GCIB may be modified. For example, the beam energy distribution function for the GCIB is modified by directing the GCIB along a GCIB path through an increased pressure such that at least a portion of the GCIB traverses the increased pressure region. The extent of modification to the beam energy distribution may be characterized by a pressure-distance (d) integral along that portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. The pressure-distance integral along that portion of the GCIB path may be equal to or greater than about 0.0001 torr-cm. Alternatively, the pressure-distance integral along that portion of the GCIB path may be equal to or greater than about 0.001 torr-cm. Alternatively yet, the pressure-distance integral along that portion of the GCIB path may be equal to or greater than about 0.01 torr-cm.

Alternatively, the beam energy distribution function for the GCIB is modified by modifying or altering a charge state of the GCIB. For example, the charge state may be modified by adjusting an electron flux, an electron energy, or an electron energy distribution for electrons utilized in electron collision-induced ionization of gas clusters.

As described above, one or more GCIBs may be utilized to modify one or more properties in one or more layers of the trap layer structure. The one or more layers may include a tunneling insulating layer, a charge trap layer, a blocking insulating layer, or a gate electrode, or a combination of two or more thereof. One or more properties in one or more sub-layers of the one or more layers of the trap layer structure may also be modified. Additionally, as described above, the concentration of one or more species, the concentration profile of one or more species, or the depth to which the concentration or concentration profile is modified may be varied using one or more GCIBs. For example, one or more species may be introduced to the one or more layers of the trap layer structure, and the concentration of the one or more species may be graded through one or more sub-layers in the one or more layers or graded throughout the one or more layers. Each specie that is introduced to the one or more layers may have a different concentration, concentration profile, and/or depth than another specie. However, each specie may have the same or similar concentration, concentration profile, and/or depth than another specie.

In another embodiment, a concentration of a first specie present in the one or more layers of the trap layer structure is modified, and a second specie is introduced to the one or more layers of the trap layer structure.

As an example, the oxygen content of a tunneling insulating layer, a charge trap layer, a blocking insulating layer, or a gate electrode may be altered using one or more GCIBs. For example, the tunneling insulating layer, the charge trap layer, the blocking insulating layer, or the gate electrode may comprise an oxide, a nitride, or an oxynitride. The one or more GCIBs may use a pressurized gas mixture comprising an oxygen-containing gas and an optional inert gas. For example, the oxygen-containing gas may include $O_2$, NO, $NO_2$, $N_2O$, CO, or $CO_2$, or any combination of two or more thereof.

As another example, the nitrogen content of a tunneling insulating layer, a charge trap layer, a blocking insulating layer, or a gate electrode may be altered using one or more GCIBs. For example, the tunneling insulating layer, the charge trap layer, the blocking insulating layer, or the gate electrode may comprise an oxide, a nitride, or an oxynitride. The one or more GCIBs may use a pressurized gas mixture comprising a nitrogen-containing gas and an optional inert gas. For example, the nitrogen-containing gas may include $N_2$, NO, $NO_2$, $N_2O$, $NH_3$, or $NF_3$, or any combination of two or more thereof.

As another example, the silicon content of a tunneling insulating layer, a charge trap layer, a blocking insulating layer, or a gate electrode may be altered using one or more GCIBs. For example, the tunneling insulating layer, the charge trap layer, the blocking insulating layer, or the gate electrode may comprise a silicon nitride, a silicon oxynitride, a silicide, or a silicate. The one or more GCIBs may use a pressurized gas mixture comprising a silicon-containing gas and an optional inert gas. For example, the silicon-containing gas may include $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, or $SiF_4$, or $NF_3$, or any combination of two or more thereof.

The treatment of the tunneling insulating layer, the charge trap layer, the blocking insulating layer, or the gate electrode using one or more GCIBs may facilitate increasing a concentration of a depleted specie, or decreasing a concentration of a surplus specie. Additionally, the treatment of the tunneling insulating layer, the charge trap layer, the blocking insulating layer, or the gate electrode using one or more GCIBs may facilitate modification of an optical, a thermal, a chemical, and/or an electrical property of the thin film, such as a refractive index, a thermal conductivity, a thermal stability, a dielectric constant, a work function, a chemical resistance to, for example, various etch chemistries, etc.

In addition to modifying one or more properties in one or more layers of the trap layer device, the one or more layers to be treated may be pre-treated or post-treated. For example, the one or more layers may be subjected to GCIB treatment, such as irradiation by an inert beam, before or after the modification process described above. Additionally, for example, the one or more layers may be exposed to an inert GCIB, such as an Ar GCIB, prior to the modification process in order to alter the penetration depth of the ensuing modification process.

Furthermore, the one or more layers may be annealed. The one or more layers may be annealed via a thermal treatment, wherein the temperature of the one or more layers is elevated to a material-specific temperature for a period of time. The temperature and the time for the annealing process may be adjusted in order to vary the properties of the one or more layers. For example, the temperature of the one or more layers may be elevated to a value greater than about 800 degrees C. Additionally, for example, the temperature of the one or more layers may be elevated to a value greater than about 850 degrees C. Additionally yet, for example, the temperature of the one or more layers may be elevated to a value greater than about 900 degrees C. Furthermore, for example, the time for the annealing process may be greater than about 1 millisecond. The annealing process may be performed at atmospheric pressure or reduced pressure. Additionally, the annealing process may be performed with or without an inert gas atmosphere. Furthermore, the annealing process may be performed in a furnace, a rapid thermal annealing (RTP) system, a flash lamp annealing system, or a laser annealing system.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of preparing a floating trap type device on a substrate, comprising:
    forming a trap layer structure on a substrate, wherein said trap layer structure contains a charge trap layer; and
    modifying a composition in said charge trap layer to controllably create defects for charge retention by exposing said charge trap layer to a gas cluster ion beam (GCIB).

2. The method of claim 1, wherein said trap layer structure is utilized in a non-volatile type memory device or charge trap flash memory device.

3. The method of claim 1, wherein said trap layer structure is utilized in a SONOS device, or a TANOS device.

4. The method of claim 1, wherein said forming said trap layer structure comprises:
    forming a tunneling insulating layer on said substrate;
    forming said charge trap layer on said tunneling insulating layer;
    forming a blocking insulating layer on said charge trap layer; and
    forming a gate electrode on said blocking insulating layer.

5. The method of claim 4, wherein said substrate comprises a single crystal silicon layer, a polycrystalline silicon (poly-silicon) layer, a silicon-on-insulator (SOI) substrate, or a silicon on silicon-germanium (SiGe) substrate, or any combination of two or more thereof.

6. The method of claim 4, wherein said tunneling insulating layer comprises silicon oxide, silicon oxynitride (SiON), silicon nitride, a silicon oxide layer having a nitride portion, aluminum oxide ($Al_2O_3$), hafnium aluminate (HfAlO), hafnium aluminum oxynitride (HfAlON), hafnium silicate (HfSiO), or hafnium silicon oxynitride (HfSiON), or any combination of two or more thereof.

7. The method of claim 4, wherein said charge trap layer comprises poly-silicon, silicon nitride, silicon oxynitride, silicon-rich oxide, a ferroelectric material, nano-crystalline silicon, nano-crystalline silicon germanium, nano-crystalline metal, amorphous silicon (a-Si), aluminum oxide ($Al_2O_3$), aluminum nitride (AlN), hafnium oxide ($HfO_2$), yttrium oxide ($Y_2O_3$), lanthanum oxide ($La_2O_3$), an aluminate, hafnium aluminate (HfAlO), hafnium aluminum oxynitride (HfAlON), hafnium silicate (HfSiO), hafnium silicon oxynitride (HfSiON), zirconium oxide ($ZrO_2$), zirconium aluminate (ZrAlO), tantalum oxide ($Ta_2O_5$), or titanium oxide ($TiO_2$), or any combination of two or more thereof.

8. The method of claim 4, wherein said blocking insulating layer comprises silicon oxide, silicon oxynitride (SiON), silicon nitride, an oxide of a Group 3, 13, 4, 14, or 5 element, an oxynitride of a Group 3, 13, 4, 14, or 5 element, or a metal oxide or oxynitride doped with a Group 4 or 14 element.

9. The method of claim 4, wherein said gate electrode comprises undoped poly-silicon, doped poly-silicon, tantalum (Ta), tantalum nitride (TaN), tantalum titanium (TaTi), tantalum platinum (TaPt), tantalum silicon nitride (TaSiN), titanium (Ti), titanium nitride (TiN), titanium aluminide (Ti3Al), titanium aluminum nitride ($Ti_2AlN$), tungsten (W), tungsten nitride (WN), tungsten silicide (WSi), hafnium (Hf), hafnium nitride (HfN), niobium (Nb), molybdenum (Mo), molybdenum nitride ($Mo_2N$), ruthenium (Ru), ruthenium dioxide ($RuO_2$), nickel silicide (NiSi), palladium (Pd), iridium (Jr), platinum (Pt), cobalt (Co), cobalt silicide (CoSi), or aluminum silicide (AlSi), or any combination of two or more thereof.

10. The method of claim 4, wherein said gate electrode comprises a multi-layered conducting structure including an energy barrier layer, a barrier metal layer, and a low resistance layer.

11. The method of claim 1, wherein said modifying said charge trap layer comprises:
    providing said substrate in a reduced-pressure environment;
    generating said GCIB in said reduced-pressure environment from a pressurized gas mixture;
    selecting a beam acceleration potential and a beam dose to modify said composition of said charge trap layer;
    accelerating said GCIB according to said beam acceleration potential; and
    irradiating said accelerated GCIB onto at least a portion of said substrate according to said beam dose.

12. The method of claim 1, wherein said charge trap layer comprises an oxide, a nitride, or an oxynitride.

13. The method of claim 12, wherein said pressurized gas mixture comprises a nitrogen-containing gas and an optional inert gas, or an oxygen-containing gas and an optional inert gas.

14. The method of claim 13, wherein said pressurized gas mixture comprises a noble gas, $O_2$, $CO_2$, CO, $N_2$, $NH_3$, $NF_3$, NO, $N_2O$, or $NO_2$, or any combination of two or more thereof.

15. The method of claim 1, further comprising
    modifying a depth or a concentration profile or both a depth and concentration profile of said composition in said charge trap layer.

16. The method of claim 1, further comprising
    introducing a first specie to said charge trap layer in said trap layer structure;

introducing another specie to one or more other layers in said trap layer structure; and modifying a concentration of said another specie in said one or more other layers in said trap layer structure.

17. The method of claim 16, wherein at least one of said one or more other layers in said trap layer structure is modified by introducing an element selected from the group consisting of B, C, Si, Ge, N, P, As, O, S, and Cl.

18. A method of preparing a floating trap type device on a substrate, comprising:

forming a tunneling insulating layer on said substrate;

forming a charge trap layer on said tunneling insulating layer;

forming a blocking insulating layer on said charge trap layer; and forming a gate electrode on said blocking insulating layer; and exposing said charge trap layer to a gas cluster ion beam (GCIB) to infuse one or more of B, C, Si, Ge, N, P, As, O, S, or Cl into said charge trap layer to controllably create defects for charge retention.

19. The method of claim 18, wherein said charge trap layer comprises an oxide, a nitride, or an oxynitride, and wherein said exposing includes exposing said charge trap layer to said GCIB to infuse O and/or N into said charge trap layer to increase a concentration of said O and/or N therein.

20. The method of claim 18, wherein said charge trap layer comprises silicon nitride, silicon oxynitride, a silicide, or a silicate, and wherein said exposing includes exposing said charge trap layer to said GCIB to infuse Si, O and/or N into said charge trap layer to increase a concentration of said Si, O and/or N therein.

21. The method of claim 1, further comprising:

modifying a composition of one or more other layers in said trap layer structure by exposing at least one of said one or more other layers of said trap layer structure to another gas cluster ion beam (GCIB).

22. The method of claim 1, wherein said GCIB contains Si, O, or N, or any combination of two or more thereof.

* * * * *

UNITED STATES PATENT AND TRADEMARK OFFICE
CERTIFICATE OF CORRECTION

| | |
|---|---|
| PATENT NO. | : 7,947,582 B2 |
| APPLICATION NO. | : 12/394215 |
| DATED | : May 24, 2011 |
| INVENTOR(S) | : John J. Hautala et al. |

Page 1 of 1

It is certified that error appears in the above-identified patent and that said Letters Patent is hereby corrected as shown below:

In column 2, line 62, "but do not denote" should read --but does not denote--.

In column 5, line 4, "SiON))." should read --SiON).--.

In column 15, line 27, "decrease the final concentration." should read --decreases the final concentration.--.

In column 18, line 28, Claim 9, "(Ti3Al)," should read --(Ti$_3$Al),--.

In column 18, lines 32-33, Claim 9, "iridium (Jr)," should read --iridium (Ir),--.

Signed and Sealed this
Ninth Day of August, 2011

David J. Kappos
*Director of the United States Patent and Trademark Office*